(12) United States Patent
Weber (10) Patent No.: US 7,556,543 B2
(45) Date of Patent: Jul. 7, 2009

(54) ONE-PIECE PC BOARD MAGNET WIRE TERMINAL

(75) Inventor: Ronald Martin Weber, Annville, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/926,657

(22) Filed: Oct. 29, 2007

(65) Prior Publication Data

US 2009/0111311 A1      Apr. 30, 2009

(51) Int. Cl.
*H01R 11/22* (2006.01)

(52) U.S. Cl. .................................... 439/857

(58) Field of Classification Search ............... 439/825, 439/884, 79, 395, 398, 404, 67, 329; 361/119, 361/111, 824
See application file for complete search history.

(56) References Cited

U.S. PATENT DOCUMENTS

| 4,026,013 | A | | 5/1977 | Hughes | |
|---|---|---|---|---|---|
| 4,118,103 | A | | 10/1978 | Leidy et al. | |
| 4,648,676 | A | * | 3/1987 | Carrell | 439/404 |
| 4,660,917 | A | * | 4/1987 | DeRoss et al. | 439/404 |
| 5,782,652 | A | | 7/1998 | Feher et al. | |
| 5,820,402 | A | * | 10/1998 | Chiacchio et al. | 439/398 |
| 6,325,659 | B1 | * | 12/2001 | Heinzen et al. | 439/404 |
| 2007/0254521 | A1 | * | 11/2007 | D'Agostini et al. | 439/404 |

* cited by examiner

Primary Examiner—Alexander Gilman (57) ABSTRACT

A system and method for terminating a wire to an electrical device, such as a printed circuit board, is disclosed. The system includes a terminal having slots configured to receive, secure and form an electrical connection with the wire. The terminal also has compliant electrical contact fingers that form a physical and electrical connection with the electrical device, thereby electrically connecting and physically securing the wire to the device. The compliant fingers exert a normal force on the electrical device to secure the terminal and wire to the electrical device.

19 Claims, 9 Drawing Sheets

ONE-PIECE PC BOARD MAGNET WIRE TERMINAL

FIELD OF THE INVENTION

The present invention is directed to a wire terminal for terminating a wire to an electrical device. More particularly, the invention is directed to a magnetic wire terminal for terminating a magnet wire to a printed circuit board.

BACKGROUND OF THE INVENTION

The termination of wires, and in particular small gauge wires, has presented numerous difficulties because of the fineness and inherent frailties of such wires. Very small gauge wires used in devices such as appliance timers, clock motors and other electrical devices have a wire size on the order of number 34 gauge to number 18 gauge have been particularly difficult to effectively terminate. Many of these devices use printed circuit boards (PCBs) in control and power electrical systems, and the termination of wires to PCBs and/or other electrical terminals in these devices is an increasingly important issue.

Up to this time, wires have been terminated to printed circuit boards (PCBs) by soldering or by the use of a secondary connector interface. For example, magnet wires have been connected to PCB's having insulation displacement slots by electrical terminals. One such terminal is the MAG-MATE™ produced by Tyco Electronics Corporation of Wilmington, Del. The terminals have two insulation displacement slots which cut thought the tough outer varnish coating on the magnet wire providing a good electrical connection to the magnet wire. The MAG-MATE™ terminal may either then have a leaf spring contact to electrically connect with a mating terminal mounted on the PCB, or alternatively, may have an integral tabs contact extending in the opposite direction for electrically connecting with a receptacle terminal on the PCB. These terminals are typically terminated to the magnet wire by a machine that inserts the terminal into the housing, terminates the wire to the terminal, and cuts off excess wire that extends beyond the face of the housing.

However, no terminal or connection system has been developed that provides a simple termination of a wire, and in particular, a fine wire or a magnet wire, directly to a printed circuit board (PCB) by a single terminal. Furthermore, no terminal or connection system has been disclosed that allows a direct connection of a fine wire, and in particular a magnet wire, to a PCB without first fixing, by soldering or other similar method, a mating connector to the PCB surface. Therefore, there is a need for a terminal and terminal connection system that can directly connect a wire, and in particular a fine wire or magnet wire, to a PCB without first fixing a mating connector to the PCB surface.

SUMMARY OF THE INVENTION

A wire termination system and method of terminating a wire, and in particular a fine wire or a magnet wire, to an electrical device are disclosed. The system includes a terminal having slots configured to receive and form an electrical connection with the wire. The terminal having the wire received within the terminal slots forms an electrical connection with an electrical contact pad of the electrical device. The terminal also has at least two compliant contact finger configured to assist in securing the terminal to an electrical device. The compliant contact finger exerts a normal force on the electrical device to secure the terminal and wire to the electrical device.

In a first exemplary embodiment of the invention, a wire termination system is disclosed that includes an electrical device and a terminal configured to mate with the electrical device. The electrical device includes an electrical contact pad disposed on a surface of the electrical device and a slot formed in the contact pad through a thickness of the electrical device. The slot is configured to receive and secure the wire. The terminal includes a top section and a bottom section, a rear section disposed between the top section and the bottom section, and a slot in the top section and a slot in the bottom section, the slot in the top section and the slot in the bottom section having a scouring section configured to remove insulating coating from the fine wire and form an electrical connection with the wire, and a compression section for securing the wire, and at least two compliant electrical contact fingers configured to exert a nominal force on the electrical device to form an electrical connection with the contact pad when the terminal and electrical device are mated.

In a first embodiment of a terminal used in the wire termination system, the terminal includes at least one compliant electrical contact finger in the top section and at least one compliant electrical contact finger in the bottom section. In a second embodiment of a terminal used in the wire termination system, the terminal includes two compliant electrical contact fingers in either the top section or the bottom section. The two compliant electrical contact fingers in either the top section or the bottom section are separated by a slot. In a third embodiment of a terminal used in the wire termination system, the terminal includes two compliant electrical contact fingers in the top section and two compliant electrical contact fingers in the bottom section.

The compliant electrical contact fingers may have contact sections having leading edges that are turned away from the electrical device when the terminal and electrical device are mated. Alternatively, the compliant fingers may have contact sections having leading edges that are turned towards the electrical device when the terminal and electrical device are mated.

In a fourth embodiment of a terminal used in the wire termination system, the terminal includes two compliant electrical contact fingers extending from the terminal rear section and extend alongside the top section and two compliant electrical contact fingers extend from the terminal rear section and extend alongside the bottom section. The compliant electrical contact fingers have contact sections that are turned towards the electrical device when the terminal and electrical device are mated.

A second exemplary embodiment of the invention includes a terminal for terminating a wire to an electrical device is disclosed. The terminal includes a top section, a bottom section, and a rear section disposed between the top section and the bottom section, a slot formed in the top section and bottom section configured to receive the wire, and at least two compliant electrical contact fingers configured to exert a normal force on the electrical device and to form an electrical connection between the wire and the contact pad when the terminal, wire and electrical device are mated. The slot has a scoring section configured to remove insulating coating from the wire and form an electrical connection with the wire and a compression section for securing the wire.

The terminal may include at least one compliant electrical contact finger formed into the top section and at least one compliant electrical contact finger formed into the bottom section. For example, the terminal may include two compliant electrical contact fingers formed into either the bottom section or the top section. Alternatively, the terminal may include two compliant electrical contact fingers formed in the top section and two compliant electrical contact fingers formed in the bottom section. The two compliant electrical contact fingers in the top section are separated by a slot in the top section, and the two compliant electrical contact fingers in the bottom section are separated by a slot in the bottom section. The compliant electrical contact fingers may have contact sections having leading edges that are turned away from the electrical device when the terminal and electrical device are mated. Yet alternatively, the terminal may include two compliant electrical contact fingers extending from the terminal rear section and extending along the top section and two compliant electrical fingers extending from the terminal rear section and extending along the bottom section.

Further aspects of the method and system are disclosed herein. The features as discussed above, as well as other features and advantages of the present invention will be appreciated and understood by those skilled in the art from the following detailed description and drawings.

DETAILED DESCRIPTION OF THE INVENTION

The present invention now will be described more fully hereinafter with reference to the accompanying drawing, in which a preferred embodiment of the invention is shown. This invention may, however, be embodied in many different forms and should not be construed as limited to the embodiments set forth herein; rather, these embodiments are provided so that this disclosure will be thorough and complete and will fully convey the scope of the invention to those skilled in the art.

Figure 1:
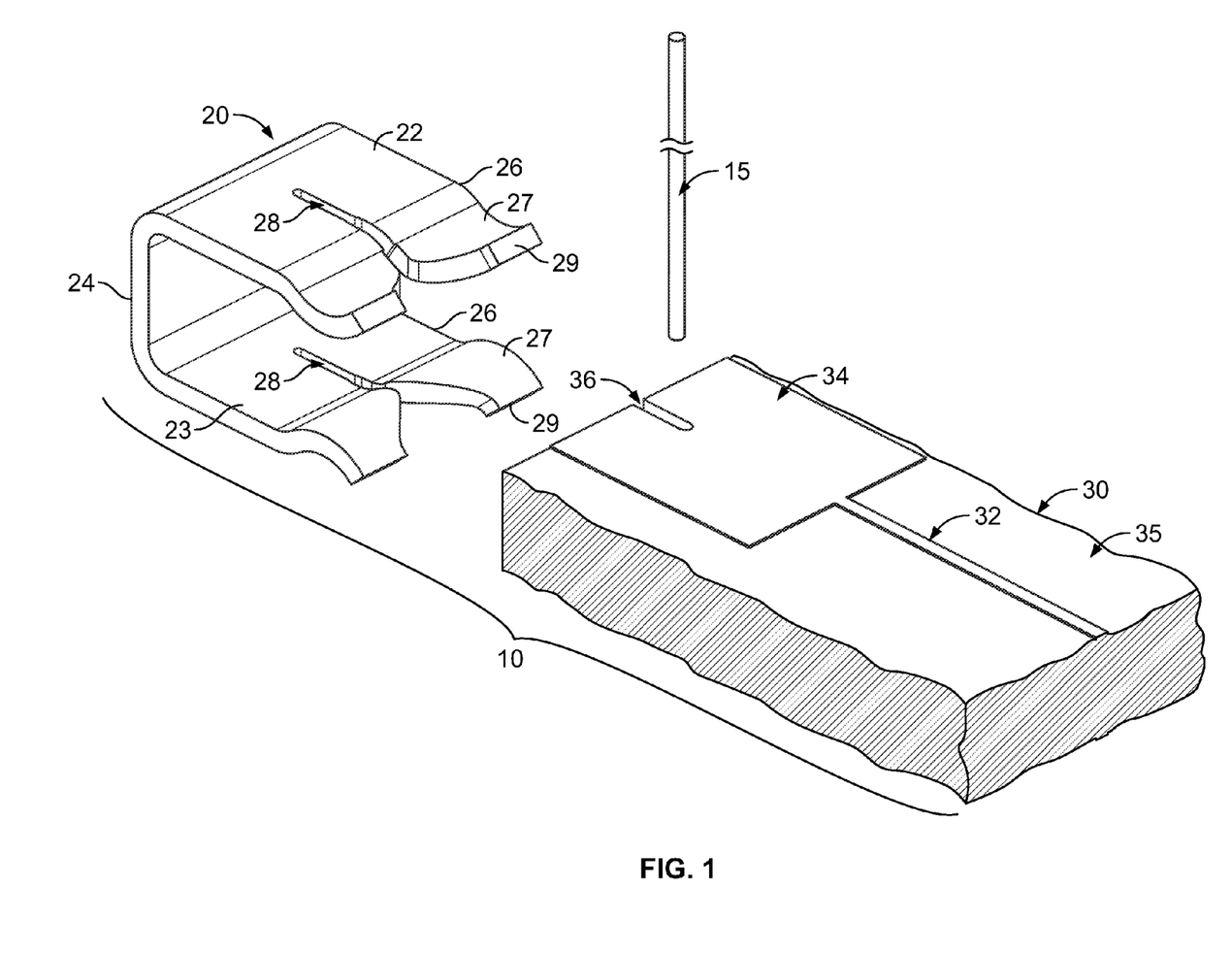
FIG. 1 illustrates an exploded view of an exemplary wire termination system according to a first embodiment of the invention.

Referring to FIG. 1, a first exemplary embodiment of a wire termination system 10 prior to assembly is shown. Wire termination system 10 includes a terminal 20 and a section of an electrical device 30. The electrical device 30 may be a printed circuit board (PCB), or other device having an electrically conductive trace 32. The conductive trace 32 includes contact pad 34 and is disposed on surface 31 of the device 30. A wire slot 36 is formed in the contact pad 34 as shown in FIG. 1. The wire termination system 10 is used to form an electrical connection between a wire 15 and the trace 32 when assembled.

Figure 2:
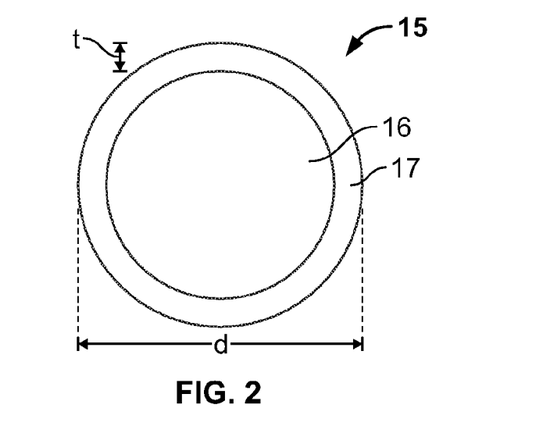
FIG. 2 shows an end view of an exemplary magnet wire according to the first embodiment of the invention.

An example of a wire 15 is shown in FIGS. 1 and 2. Wire 15 may be a magnet wire or other suitable wire of small gauge number. For example, the wire may be between 34 gauge and 18 gauge. As shown in FIG. 2, the wire 15 includes a conductive core 16 and an insulating coating 17. The insulating coating 17 may be a varnish or other similar dielectric coating material. The wire 15 has an outside diameter d. The diameter d may be between about 0.006 inches and about 0.040 inches, and preferably has a diameter d of about 0.010 inches. The insulating coating 17 may have a thickness t of about 0.001 inches.

Figure 3:
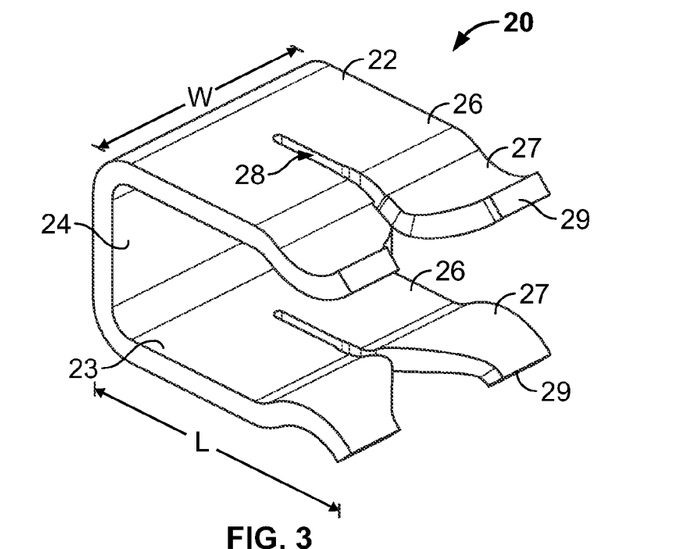
FIG. 3 illustrates a perspective view of an exemplary terminal used in the wire termination system according to the first embodiment of the invention.

An exemplary embodiment of terminal 20 is shown in FIG. 3. The terminal 20 includes a top section 22, a bottom section 23, and a rear section 24 disposed between the top section and the bottom section. The top section 22 includes compliant electrical contact fingers 26. The bottom section also includes compliant electrical contact fingers 26. Contact fingers 26 include contact sections 27. Contact sections 27 are formed into contact fingers 26 by deforming material of the contact finger 26 so that opposing contact fingers 26 are brought closer together as shown in FIG. 3. The contact sections 27 include turned out leading edges 29. The contact fingers 26 are limited to contact fingers that exert sufficient force when engaged to an electrical device 30 (FIG. 1) to secure the terminal 20 to the electrical device 30. Contact fingers 26 in the top section 22 are separated by a slot 28. Similarly, contact fingers 26 in the bottom section 23 are separated by another slot 28.

Figure 4:
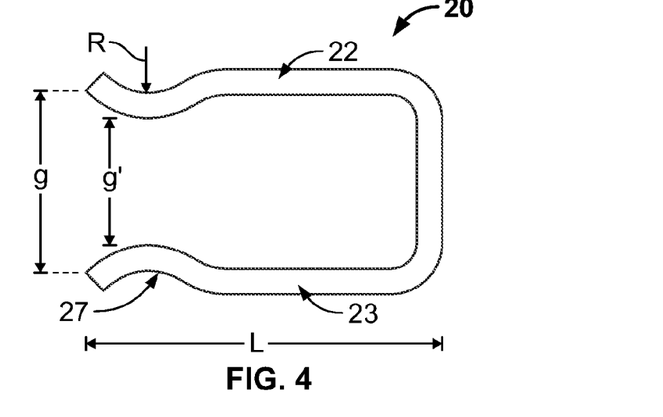
FIG. 4 shows a side view of the exemplary terminal of FIG. 3.

As shown in FIGS. 3 and 4, the terminal 20 has a width W and a length L. The top section 22 and the bottom section 23 are separated by a maximum first gap g and a minimum second gap g'. The difference between the first gap g and the second gap g' is the amount of deformation of the contact sections 27.

For example, the terminal 20 may have a width W of between about 0.120 inches and about 0.140 inches, and preferably has a width W of about 0.135 inches. The terminal 20 may have a length L of between about 0.120 inches and about 0.150 inches, and preferably has a length L of about 0.135 inches. The terminal 20 may have a first gap g of between about 0.080 inches and about 0.090 inches, and preferably about 0.085 inches, and a second gap g' of between about 0.055 inches and about 0.065 inches, and preferably of about 0.060 inches. As shown in FIGS. 3 and 4, the terminal 20 has a generally U-shaped cross-section. The contact sections 27 having a formed radius R. In one embodiment, the radius R may be approximately 0.030 inches.

Figure 5:
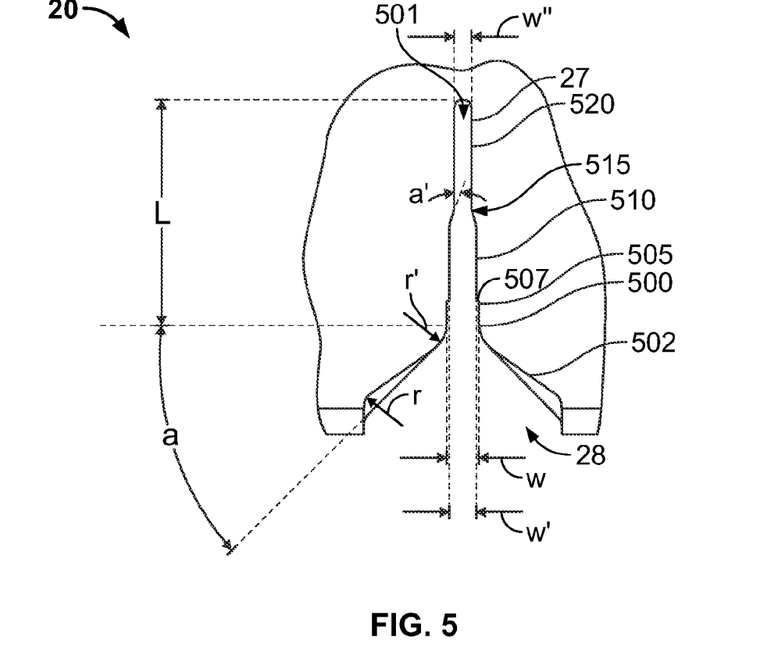
FIG. 5 shows a top view of the exemplary terminal of FIG. 3.

A top view of the terminal 20 is shown in FIG. 5. As can be seen in FIG. 5, the slot 28 includes a receiving section 500 having a width w, a scoring section 510 having a width w', and a compression section 520 having a width w". The slot 28 has a length L and includes slot end point 501. The terminal 20 has guiding edges 502 that assist in guiding the wire 15 (FIG. 1) into the slot 27. The guiding edges 502 have a lead-in radius r and a guide-in radius r' as shown on FIG. 5. For example, the lead-in radius R may be between about 0.008 inches and about 0.012 inches, and preferably is about 0.010 inches. The guide-in radius r' may be between about 0.018 inches and about 0.022 inches, and preferably about 0.020 inches.

As also shown in FIG. 5, a step 505 having a front edge 507 separates the receiving section 500 from the scoring section 510. The step 505 is formed from the difference of the width w of the receiving section 520 and the width w' of the scoring section 510 in the slot 28. A transition section 515 separates the scoring section 510 from the compression section 520. The transition section 515 has a lead-in angle a' of between about 10° to about 20°, and preferably of about 15°. The width w of the receiving section 500 should permit the wire 15 (FIGS. 1 and 2) having a diameter d (FIG. 2) to enter the gap 28 without compression or scoring until reaching the step 505.

As can be seen by referring to FIG. 5, the width w' of the scouring section 510 is selected to configure the step 505 to remove an amount of the insulating coating 17 (FIG. 2) of the wire 15 (FIG. 2) as the wire 15 is pushed past the step 505 and into the scoring section 510. The step 505 and the scoring section 510 are configured to remove sufficient coating 17 from the wire 15 to form an electrical contact between the contact 20 and the wire 15. The scoring section 510 may remove additional amounts of insulating coating 17 from the wire 15 as the wire 15 is pushed further into the slot and into the compression section 520. The scouring section 510 may also scour and/or remove some conductive material of the core 16.

As can be further seen in FIG. 5, the transition section 515 includes a lead-in angle a' that allows the wire 15 to be inserted into the compression 520 with minimal risk of breaking the wire 15. For example, for a wire 15 (FIG. 1) having a diameter d of 0.010 inches, the width w of the receiving section 500 may be between about 0.010 inches and 0.011 inches, the width w' of the scouring section 510 may be between about 0.007 inches to about 0.009 inches, and the width w" of the compression section may be between about 0.005 inches and about 0.006 inches.

As can be also seen by referring to FIG. 5, the width w" of the compression section 520 is configured to compress the conductive core 16 (FIG. 2) of the wire 15 (FIG. 2) and secure the wire 15 to the terminal 20. By compressing the conductive core 16, the terminal 20 secures and provides an electrical connection between the wire 15 and the wire termination system 10 (FIG. 1).

The terminal 20 is formed of a conductive material, for example, but not limited to brass, phosphor bronze and beryllium copper alloys. The terminal may be plated. For example, the terminal 20 may be formed of a brass alloy sheet. The sheet may have a thickness of between about 0.0122 inches and about 0.0130, and preferably has as thickness of about 0.0126 inches. The terminal 20 may be formed by stamping or cutting a blank, and then working and forming the blank into the desired shape as shown in FIG. 2. Alternatively, the terminal 20 may be formed by other forming processes as know in the art.

Figure 6:
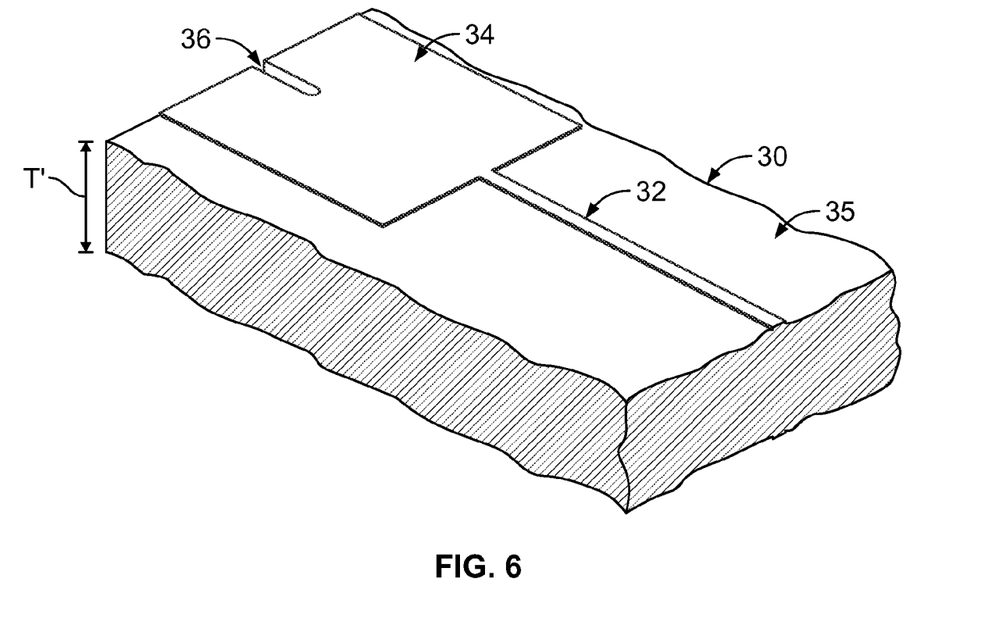
FIG. 6 illustrates an exemplary section of an electrical device used in the wire termination system according to the first embodiment of the invention.
Figure 7:
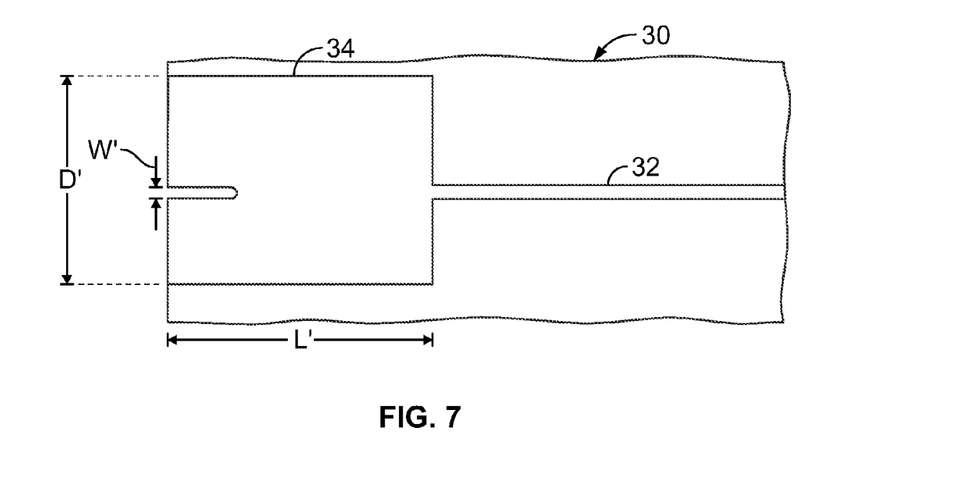
FIG. 7 shows a top view of the exemplary section of an electrical device of FIG. 6.

The section of the electrical device 30 from FIG. 1 is shown in more detail in FIG. 6, and a top view of which is shown in FIG. 7. As can be seen in FIGS. 6 and 7, the electrical device 30 includes conductive trace 32 disposed on a surface 31 of the electrical device 30. The conductive trace 32 includes a contact pad 34. In this embodiment, the electrical trace 32 and contact pad 34 are shown on the surface 31 of the electrical device, however, it should be apparent to one of ordinary skill that the trace 32 and the pad 34 may appear on the opposite surface (not shown) or on both surfaces. As shown in FIG. 6, the electrical device 30 has a thickness T' proximate to contact pad 34. In one example, the thickness T' proximate the contact pad 34 may vary between about 0.040 inches and 0.065 inches. The thickness of the electrical device 30 at other positions may vary. As shown in FIG. 7, the contact pad 34 has a width W' and a length L'. The width W' and length L' of the contact pad 34 are approximately the same or greater than the width W and length L of the terminal 20 (FIG. 3). The dimensions of the pad 34 are selected to allow the pad 34 to form an electrical connection with terminal 20 (FIG. 1) when the terminal 20 is engaged with the device 30. The contact sections 27 (FIG. 1) of the contact fingers 26 (FIG. 1) will be in contact with the pad 30 and form an electrical connection between the contact sections 27 of the terminal 20 (FIG. 1) and the contact pad 34.

The contact pad 34 has a contact slot 36 for receiving wire 15 (FIGS. 1 and 6). The contact slot 36 extends through the thickness T' of the electrical device 30. The contact slot 36 has a gap width W' that is greater than width d of wire 15 (FIG. 2), allowing the wire 15 to be inserted with little or no force into slot 36.

Figure 8:
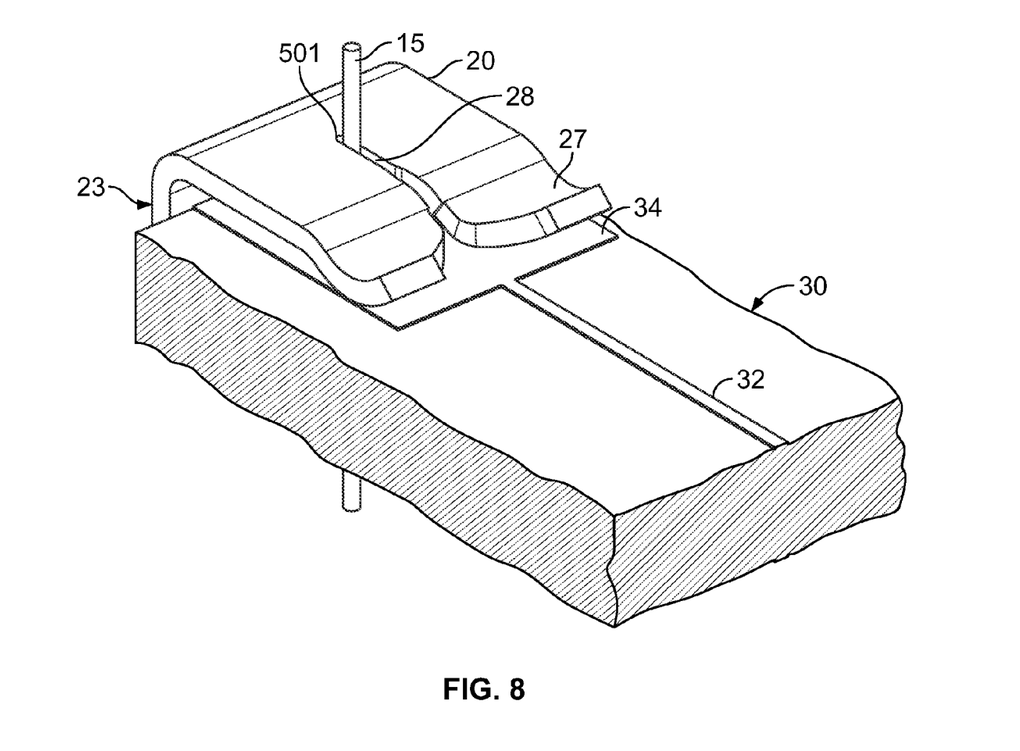
FIG. 8 illustrates an exemplary configuration of a terminal electrically connecting a magnet wire to a section of an electrical device.

An exemplary method of forming an electrical connection between a wire 15 and an electrical device 30 using the wire termination system 10 will now be discussed referring to FIGS. 8 and 9. Initially, the wire 15 is received in the wire slot 36 (FIG. 6) of the device 30. As shown in FIG. 8, the terminal 20 is then mated to the device 30 while receiving the wire 15 in slot 28 up to the slot end point 501. The wire 15 is stripped of the insulating coating 17 (FIG. 2) by the scoring section 510 (FIG. 5) as the wire 15 is pushed into the slot 28 and an electrical connection is made between the terminal 20 and the wire 15. The wire 15 is then further inserted into the slot 28 until the wire 15 is secured in the compression section 530 (FIG. 5) at or proximate to the slot end point 501. An electrical connection is thus formed between the wire 15 and the terminal 20. At the same time, the contacts 27 of the terminal 20 form an electrical connection with the pad 34 as the terminal 20 is mated to the electrical device 30 as shown in FIG. 8. The wire 15 is in electrical connectivity with the terminal 20, and the terminal 20 is in electrical connectivity with the contact pad 34 of the device 30. Thus, an overall electrical connection is formed between the wire 15 and the device 30.

Figure 9:
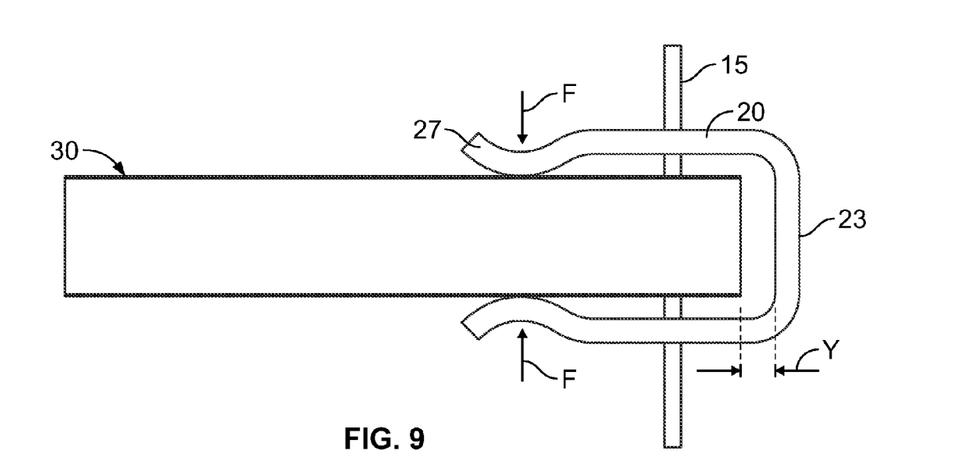
FIG. 9 shows a side view of the configuration of FIG. 8.

The terminal 20 also physically secures the wire 15 to the device 30 as shown in FIGS. 8 and 9. The minimum gap g' (FIG. 4) of the terminal 20 is slightly less than the thickness T' (FIG. 6) of the electrical device 30 proximate the contact pad 34, so that when the contact 20 is engaged with the electrical device 30, the compliant fingers 26 of the terminal 20 apply a nominal force F to the contact pad 34 as shown in FIG. 9. The normal force is applied at the contact sections 27. In addition, the width w" (FIG. 5) of the compression section 530 (FIG. 5) is selected to be slightly less than the diameter d (FIG. 2) of wire 15, securing the wire 15 in the slot 28 of terminal 20 when the wire 15 is engaged in the slot 28.

Furthermore, the slot length 1 (FIG. 5) is selected to position the wire 15 at a predetermined distance Y (FIG. 9) from the rear section 23 of the terminal 20 when the wire 15 is received up to the slot end point 501 as shown in FIG. 8. In such a manner, the contact sections 27 of the compliant fingers 26 of the top section 22 of terminal 20 make electrical and physical contact with the pad 34 of the electrical device 30 as shown in FIGS. 8 and 9. The contact sections 27 of the compliant fingers 26 of the bottom section 23 also apply a nominal force that assists in securing the terminal 20 to the electrical device 30.

Alternatively, the wire 15 may be received in the gap 28 of the terminal 20 before the terminal 20 is engaged with the electrical device 30. The terminal 20 would then be engaged with the device 30 so that the wire 15 is received in slot 28.

Figure 10:
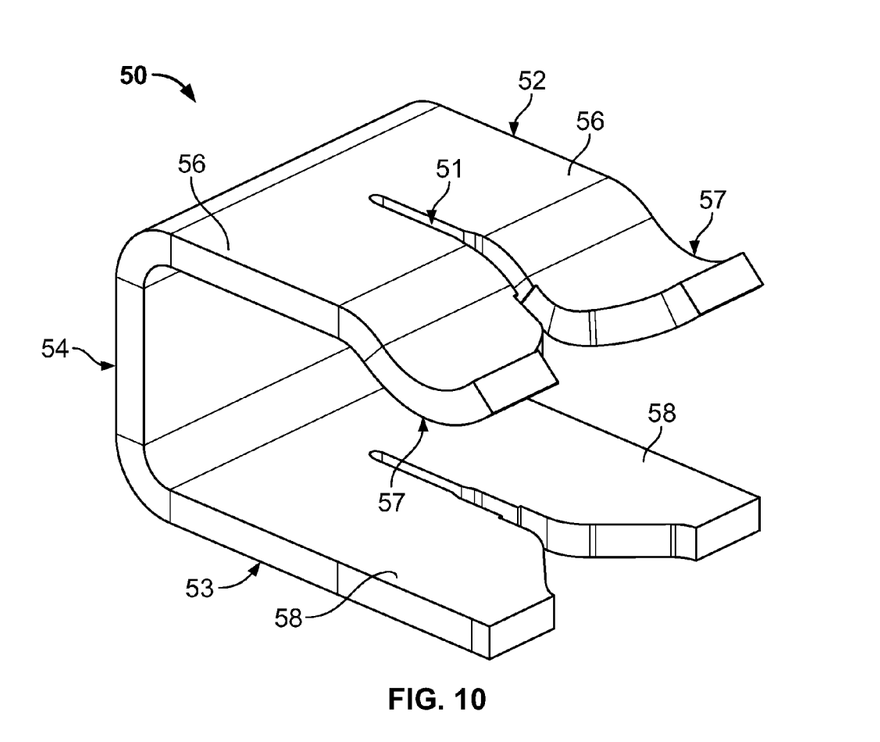
FIG. 10 illustrates an alternative embodiment of a terminal.

An alternative embodiment of a terminal 50 is shown in FIG. 10. The terminal 50 includes a top section 52, a bottom section 53, and a rear section 54. The terminal 50 includes slot 51, similarly configured to slots 28 (FIG. 3) of terminal 20 (FIG. 3). The top section 52 includes two compliant electrical contact fingers 56 as shown in FIG. 10. The compliant fingers 56 include contact sections 57. The bottom section 53 includes two fixed fingers 58. The fixed fingers 58 may also be compliant, but to a lesser degree than compliant fingers 56. The contact sections 57 of the compliant fingers 56 form an electrical connection with pad 34 (FIG. 8) of the device 30 (FIG. 8) and provide a normal force to the device 30 to secure the terminal 50 and wire 15 (FIG. 8) to the device 30. The terminal 50 electrically and physically connects the wire 15 to the device 30, similar to the contact 20 shown in FIG. 8. The fixed fingers 58 do not form an electrical connection with the device 30 (FIG. 8) when the terminal 50 secures the wire 15 (FIG. 8) to device 30 (FIG. 8), but assist in physical securing the terminal 50 to the device 30.

Figure 11:
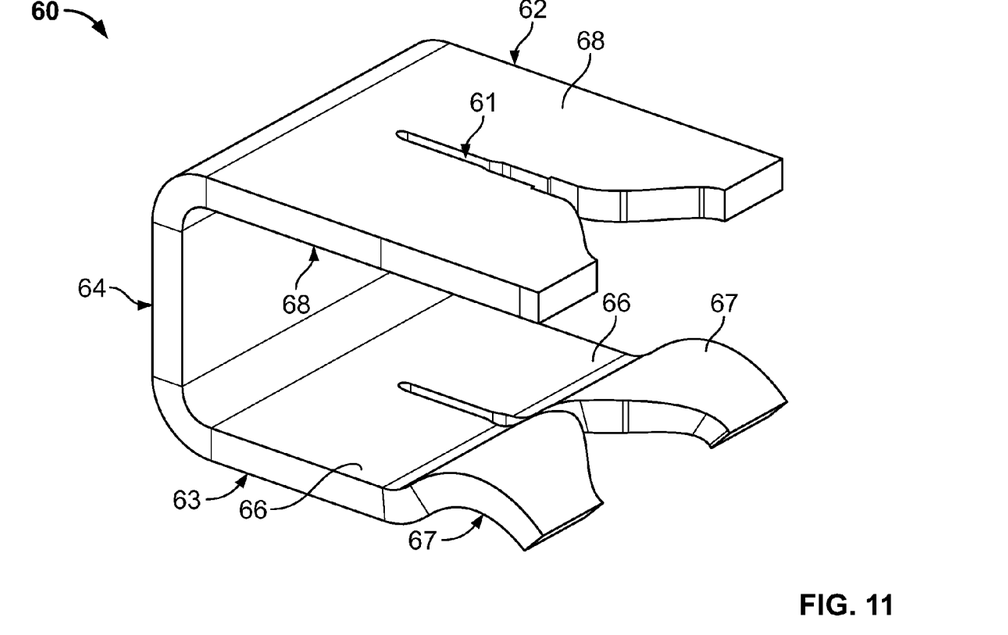
FIG. 11 illustrates a second alternative embodiment of a terminal.

A second alternative embodiment of a terminal 60 is shown in FIG. 11. The terminal 60 includes a top section 62, a bottom section 63, and a rear section 64. The terminal 60 includes slots 61, similarly configured to slot 28 (FIG. 3) of terminal 20 (FIG. 3). The top section 62 includes two fixed fingers 68. The compliant fingers 56 include contact sections 57. The bottom section 53 includes two compliant electrical fingers 66. The compliant fingers 66 include contact sections 67. The fixed fingers 68 may also be compliant, but to a lesser degree than compliant fingers 66. The compliant fingers 68 form an electrical connection with pad 34 (FIG. 8) of the device 30 (FIG. 8). The contact sections 67 of the compliant fingers 66 provide a normal force to the device 30 to secure the terminal 50 and wire 15 (FIG. 8) to the device 30. The terminal 50 electrically and physically connects the wire 15 (FIG. 8) to the device 30 (FIG. 8), similar to the contact 20 shown in FIG. 8. The compliant fingers 68 do not form an electrical connection with the device 30 (FIG. 8) when the terminal 50 secures the wire 15 (FIG. 8) to device 30 (FIG. 8), but assist in physical securing the terminal 60 to the device 30.

Figure 12:
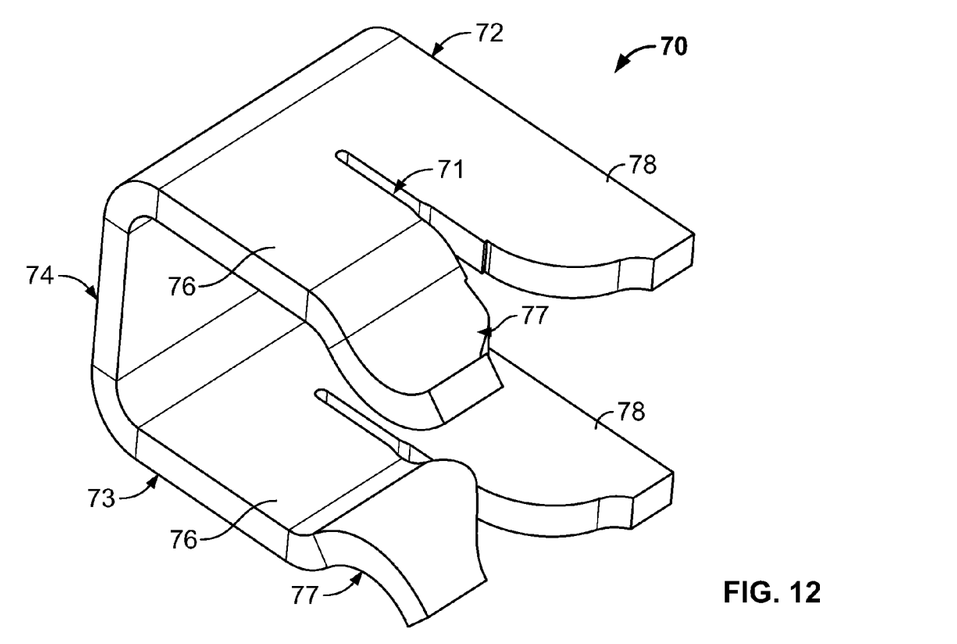
FIG. 12 illustrates a third alternative embodiment of a terminal.

A third alternative embodiment of a terminal 70 is shown in FIG. 12. The terminal 70 includes a top section 72, a bottom section 73, and a rear section 74. The top section 72 includes a compliant electrical finger 76 and a fixed finger 78. The bottom section 73 also includes a compliant electrical finger 76 and a fixed finger 78. The compliant fingers 76 include contact sections 77. The terminal 70 includes slots 71, similarly configured to slot 28 (FIG. 3) of terminal 20 (FIG. 3). The opposing compliant fingers 76 may be present on either side of the slot 71. The compliant finger 76 in the top section 72 is positioned opposite the compliant finger 76 in the bottom section 73 as shown in FIG. 12. The fixed fingers 68 may also be compliant, but to a lesser degree than compliant fingers 66. In this embodiment, the compliant finger 78 in the top section forms an electrical connection with pad 34 (FIG. 8) of the device 30 (FIG. 8). The contact sections 77 of the compliant fingers 76 in both the top section 72 and the bottom section 73 provide a normal force to the device 30 to secure the terminal 50 and wire 15 (FIG. 8) to the device 30. The terminal 50 electrically and physically connects the wire 15 (FIG. 8) to the device 30 (FIG. 8), similar to the contact 20 shown in FIG. 8. The fixed fingers 78 do not form an electrical connection or assist in securing the terminal 70 to the device 30 (FIG. 8) when the terminal 50 secures the wire 15 (FIG. 8) to device 30 (FIG. 8).

Figure 13:
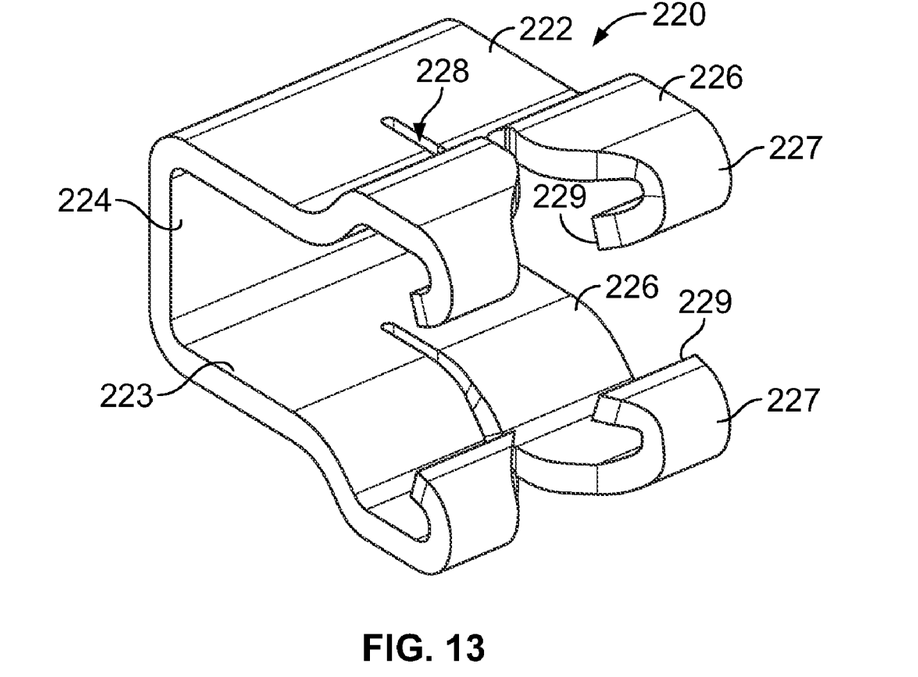
FIG. 13 illustrates a fourth alternative embodiment of a terminal
Figure 14:
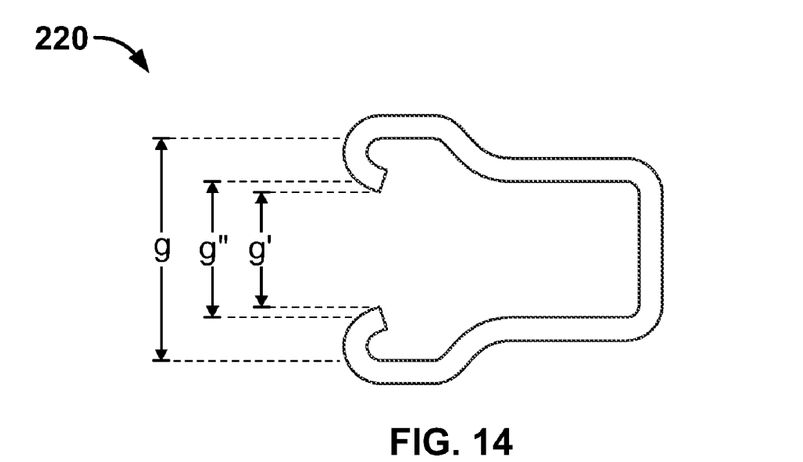
FIG. 14 shows a side view of the fourth alternative embodiment of the terminal of FIG. 13.

A fourth alternative embodiment of a terminal 220 is shown in FIGS. 13 and 14. The terminal 20 includes a top section 222, a bottom section 223, and a rear section 224. Compliant electrical contact fingers 226 are formed into the top section 222 and the bottom section 223. Fingers 226 include contact sections 227 having a leading edge 229. Fingers 26 in the top section 222 are separated by slot 228. Similarly, fingers 226 in the bottom section are separated by slot 228. The slot 228 is configured similarly to slot 28 (FIG. 2). Terminal 220 is configured similarly to terminal 20 (FIGS. 3 and 4). However, in this alternative embodiment, the maximum gap g and the minimum gap g' are as shown in FIG. 11. In addition, the terminal 220 includes a body gap g" as shown in FIG. 11.

Figure 15:
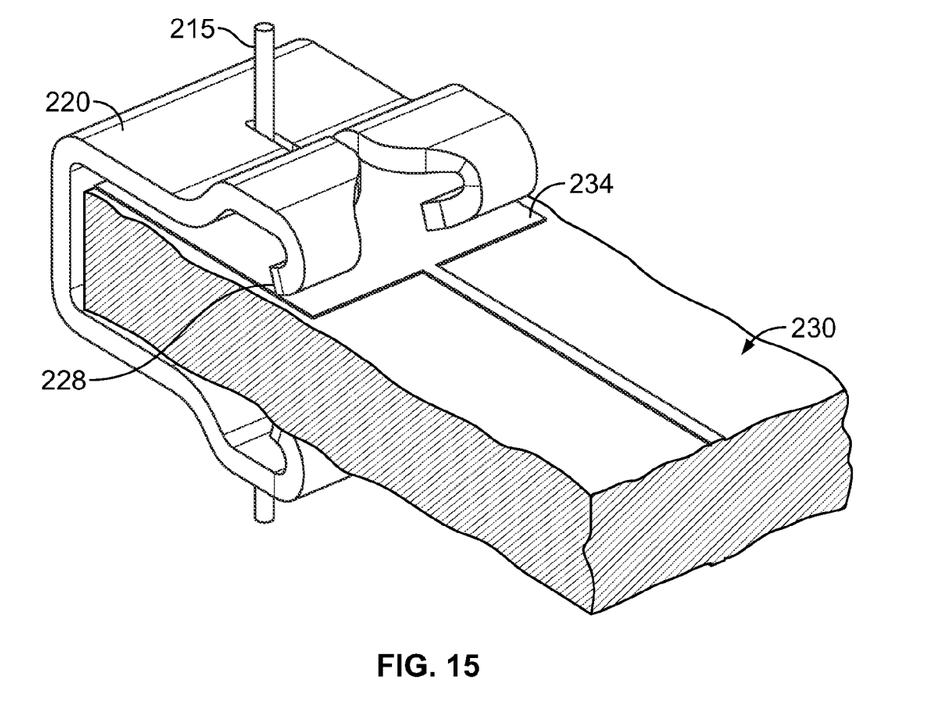
FIG. 15 illustrates an exemplary configuration of the fourth alternative embodiment of the terminal electrically connecting a fine wire to an electrical device.

The contact sections 227 of the fingers 226 are turned inward as shown in FIGS. 13 and 14. The fingers 226 are turned toward the contact pad 234 and the leading edges 229 make contact with the contact pad 234 as shown in FIG. 15 when the terminal 220 engages wire 215 and the terminal 220 is mated with the device 230. The body gap g" (FIG. 14) is selected to keep the terminal 220 from contacting an electrical device at all positions except for the leading edges. As can be seen in FIG. 15, the wire 215 is then in electrical connectivity with the terminal 220, and the terminal 220 is in electrical connectivity with the contact pad 234 of the device 230.

Figure 16:
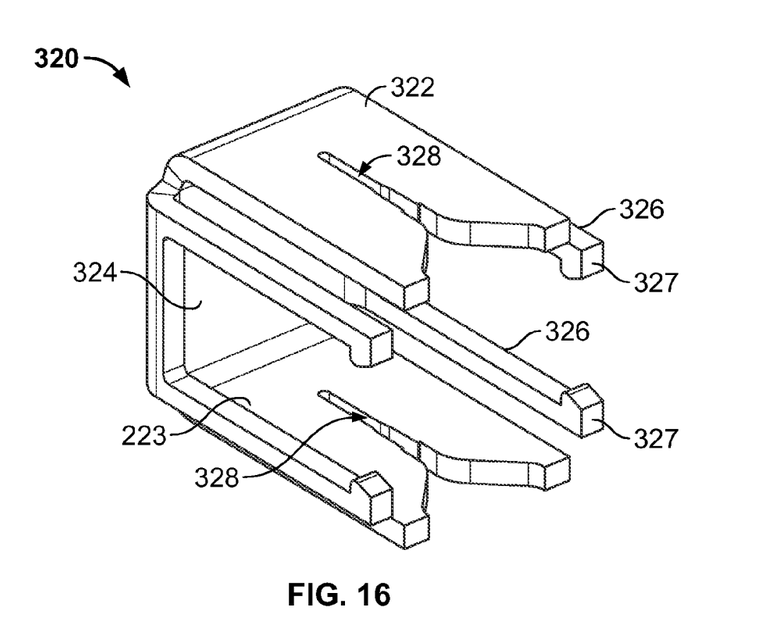
FIG. 16 illustrates a fifth alternative embodiment of a terminal.
Figure 17:
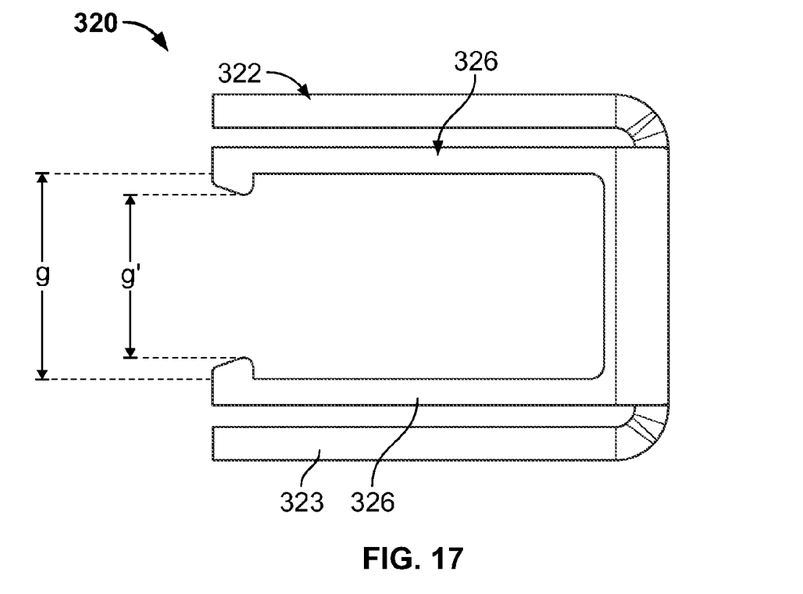
FIG. 17 shows a side view of the fifth embodiment of the terminal of FIG. 13.

Another alternative embodiment of a terminal 320 is shown in FIGS. 16 and 17. The terminal 320 includes a top section 322, a bottom section 323, and a rear section 324. The terminal 320 further includes compliant electrical contact fingers 326 that extend from the terminal rear section 324 and extend alongside the top section 322 and alongside the bottom section 323, respectively, as shown in FIG. 16. Two compliant electrical contact fingers 326 extend from the rear section 324 and extend alongside the top section 322 and two compliant electrical contact fingers 326 extend from the rear section 324 and extend alongside the bottom section 323. Fingers 326 include contact sections 327. The top section 322 and the bottom section each include a slot 328. The slot 328 is configured similarly to slot 28 (FIG. 2)

In this alternative embodiment, the terminal 320 has a general U-shaped cross-section as shown in FIGS. 16 and 17. The dimensions of the terminal 320 are configured similarly to terminal 20 (FIGS. 3 and 4).

Figure 18:
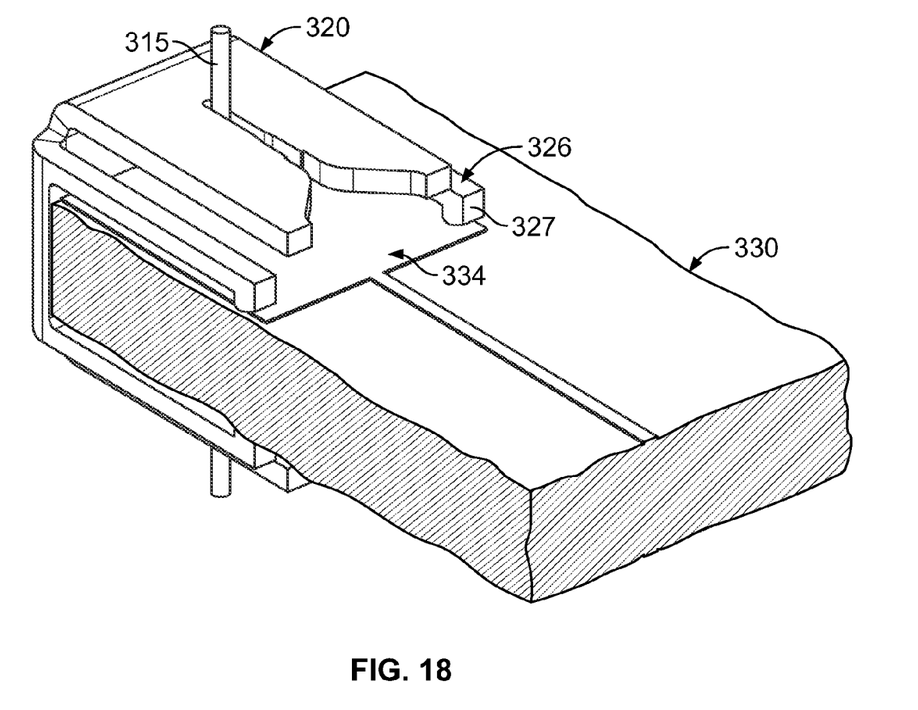
FIG. 18 illustrates an exemplary configuration of the second alternative embodiment of the terminal electrically connecting a fine wire to an electrical device.

The contact sections 327 of the fingers 326 are turned inward as shown in FIGS. 16 and 17. The contact sections 327 are turned towards and make contact with the contact pad 334 of the device 330 as shown in FIG. 18 when the terminal 320 engages wire 315 and the terminal 320 is mated with the device 330. As can be seen in FIG. 18, the wire 315 is then in electrical connectivity with the terminal 320, and the terminal 320 is in electrical connectivity with the contact pad 334 of the device 330.

It should be recognized that any number of terminals may be used with an electrical device as long as the electrical device has been configured to receive the number or terminals selected. Additionally, when multiple terminals are used with an electrical device, different embodiments of terminals may be used together.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A wire termination system for a wire, comprising:
   an electrical device, comprising:
      an electrical contact pad disposed on a surface of the electrical device; and
      a slot formed in the contact pad through a thickness of the electrical device;
      wherein the slot is configured to receive and secure the wire;
   a terminal configured to mate with the electrical device, comprising:
      a top section and a bottom section; and
      a rear section disposed between the top section and the bottom section;
      a slot in the top section and a slot in the bottom section, the slot in the top section and the slot in the bottom section having a scouring section configured to remove insulating coating from the wire and form an electrical connection with the wire, and a compression section for securing the wire; and
   at least two compliant electrical contact fingers extending from the top or bottom section configured to exert a nominal force on a contact pad of the electrical device to form an electrical connection with the contact pad when the terminal and electrical device are mated.

2. The system of claim 1, wherein the terminal comprises at least one compliant electrical contact finger extending from the top section and at least one compliant electrical contact finger extending from the bottom section.

3. The system of claim 1, wherein the terminal comprises two compliant electrical contact fingers extending from either the top section or the bottom section.

4. The system of claim 1, wherein the terminal comprises two compliant electrical contact fingers in the top section and two compliant electrical contact fingers extending from the bottom section.

5. The system of claim 3, wherein two compliant electrical contact fingers extending from either the top section or the bottom section are separated by the slot.

6. The system of claim 1, wherein the compliant electrical contact fingers have contact sections having leading edges that are turned away from the electrical device when the terminal and electrical device are mated.

7. The system of claim 1, wherein the compliant fingers have contact sections having leading edges that are turned towards the electrical device when the terminal and electrical device are mated.

8. A terminal for terminating a wire to an electrical device, comprising:
   a top section, a bottom section, and a rear section disposed between the top section and the bottom section;
   a slot formed in the top section and bottom section configured to receive the wire;
   wherein the slot has a scoring section configured to remove insulating coating from the wire and form an electrical connection with the wire and a compression section for securing the wire; and
   at least two compliant electrical contact fingers extending from the top or bottom section configured to exert a normal force on a contact pad of the electrical device and to form an electrical connection between the wire and the contact pad when the terminal, wire and electrical device are mated.

9. The terminal of claim 8, wherein at least one compliant electrical contact finger is formed into the top section and at least one compliant electrical contact finger is formed into the bottom section.

10. The terminal of claim 8, wherein two compliant electrical contact fingers are formed into either the bottom section or the top section.

11. The terminal of claim 8, wherein two compliant electrical contact fingers are formed in the top section and two compliant electrical contact fingers are formed in the bottom section.

12. The terminal of claim 11, wherein two compliant electrical contact fingers in the top section are separated by the slot in the top section and two compliant electrical contact fingers in the bottom section are separated by the slot in the bottom section.

13. The terminal of claim 8, wherein the compliant electrical contact fingers have contact sections having leading edges that are turned away from the electrical device when the terminal and electrical device are mated.

14. The terminal of claim 8, wherein the compliant fingers have contact sections having leading edges that are turned towards the electrical device when the terminal and electrical device are mated.

15. The terminal of claim 8, wherein two compliant electrical contact fingers extend from the terminal rear section and extend alongside the top section and two compliant electrical fingers extend from the terminal rear section and extend alongside the bottom section.

16. A terminal for terminating a wire to an electrical device, comprising:
   a top section, a bottom section, and a rear section disposed between the top section and the bottom section;
   a slot formed in the top section and bottom section configured to receive the wire;
   wherein the slot has a scoring section configured to remove insulating coating from the wire and form an electrical connection with the wire and a compression section for securing the wire; and
   at least two compliant electrical contact fingers extending from the rear section and configured to exert a normal force on a contact pad of the electrical device and to form an electrical connection between the wire and the contact pad when the terminal, wire and electrical device are mated.

17. The terminal of claim 16, wherein two compliant electrical contact fingers extend either alongside the top section or extend alongside the bottom section.

18. The terminal of claim 16, wherein two compliant electrical contact fingers extend alongside the top section and two compliant electrical fingers extend alongside the bottom section.

19. The terminal of claim 16, wherein the at least two compliant electrical contact fingers have a contact section that is turned towards the electrical device when the terminal and electrical device are mated.

* * * * *